United States Patent [19]
Freedenberg et al.

[11] Patent Number: 5,751,588
[45] Date of Patent: May 12, 1998

[54] MULTI-WAVELENGTH PROGRAMMABLE LASER PROCESSING MECHANISMS AND APPARATUS UTILIZING VAPORIZATION DETECTION

[75] Inventors: Candace J. Freedenberg, Poughkeepsie; David C. Long, Wappingers Falls; Joshua M. Cobb, Millbrook; Mark J. LaPlante, Walden; Uldis A. Ziemins, Poughkeepsie; Daniel G. Patterson, Wappingers Falls; James G. Balz, Maybrook, all of N.Y.

[73] Assignee: International Business Machines Corporation, Armonk, N.Y.

[21] Appl. No.: 465,689

[22] Filed: Jun. 6, 1995

Related U.S. Application Data

[63] Continuation-in-part of Ser. No. 430,480, Apr. 28, 1995, Pat. No. 5,620,618.

[51] Int. Cl.$^6$ .............................. G06F 19/00; G06G 7/64; G06G 7/66
[52] U.S. Cl. .................. 364/474.28; 364/474.08; 219/121.7; 219/121.74
[58] Field of Search .................. 364/474.08, 474.01; 219/121.6, 121.61, 121.62, 121.7, 121.71, 121.74, 121.75, 121.8, 121.82; 346/76, 108

[56] References Cited

U.S. PATENT DOCUMENTS

| | | | |
|---|---|---|---|
| 3,701,999 | 10/1972 | Congleton | 346/76 |
| 3,730,039 | 5/1973 | Fedrigo | 83/170 |
| 3,902,036 | 8/1975 | Zaleckas | 219/121 |
| 4,201,905 | 5/1980 | Clark et al. | 219/121 |
| 4,425,829 | 1/1984 | Kranik et al. | 83/62.1 |
| 4,447,112 | 5/1984 | Matsuoka et al. | 350/6.5 |
| 4,512,625 | 4/1985 | Brueggemann | 350/6.8 |
| 4,520,816 | 6/1985 | Schachar et al. | 128/303.1 |
| 4,544,442 | 10/1985 | Lassen | 156/643 |
| 4,555,798 | 11/1985 | Broadbent, Jr. et al. | 382/8 |
| 4,633,272 | 12/1986 | Hardy | 346/108 |
| 4,732,459 | 3/1988 | Hayashi | 350/454 |
| 4,789,770 | 12/1988 | Kasner et al. | 219/121.7 |
| 4,821,614 | 4/1989 | Fleet et al. | 83/100 |
| 4,921,320 | 5/1990 | DeJager et al. | 350/6.8 |
| 4,956,650 | 9/1990 | Allen et al. | 346/108 |
| 5,026,964 | 6/1991 | Somers et al. | 219/121.7 |
| 5,041,716 | 8/1991 | Wakabayashi | 219/121.68 |
| 5,168,454 | 12/1992 | Laplante et al. | 364/474.08 |
| 5,191,187 | 3/1993 | Kajikawa | 219/121.76 |
| 5,255,115 | 10/1993 | Kikuchi | 359/209 |
| 5,262,636 | 11/1993 | Rink | 250/221 |
| 5,319,183 | 6/1994 | Hosoya et al. | 219/121.68 |
| 5,327,167 | 7/1994 | Pollard et al. | 346/108 |
| 5,327,451 | 7/1994 | Walker et al. | 372/98 |

OTHER PUBLICATIONS

IBM Technical Disclosure Bulletin, vol. 13, No. 9, Feb. 1971, p. 2536.
IBM Technical Disclosure Bulletin, vol. 16, No. 12, May 1974, pp. 3933–3934.
IBM Technical Disclosure Bulletin, vol. 20, No. 4, Sep. 1977, pp. 1379–1380.

*Primary Examiner*—Reba I. Elmore
*Assistant Examiner*—Sheela S. Rao
*Attorney, Agent, or Firm*—DeLio & Peterson, LLC; Peter W. Peterson; Aziz M. Ahsan

[57] ABSTRACT

A desired design for electronic structures is converted into a graphic design format and sorted into a pseudo-raster format corresponding to scan lines. A laser or other machining beam is controlled by a separate tracking beam utilizing a mid-objective scanning system. The firing frequency of the machining beam is determined by the position of the tracking beam on a detector, as compared to the scan line data. Accuracy is verified by detection of plume or spectra generated during machining. Alignment of the machining and tracking beams is by interferometric methods. The system improves optical performance parameters of telecentricity, angle of scanned beam line, location of line in which the scanned line resides, astigmatism and field curvature.

2 Claims, 11 Drawing Sheets

MULTI-WAVELENGTH PROGRAMMABLE LASER PROCESSING MECHANISMS AND APPARATUS UTILIZING VAPORIZATION DETECTION

This is a continuation in part of U.S. application Ser. No. 02/430,480 filed Apr. 28, 1995 U.S. Pat. No. 5,620,618.

BACKGROUND OF THE INVENTION

1. Field of the Invention

The present invention relates generally to a method and apparatus for machining or otherwise processing a workpiece such as an electronic substrate with the aid of a high energy beam and a tracking beam which corrects astigmatism, bow distortion and field curvature, and more particularly to a laser processing mechanism which incorporates an astigmatically corrected catadioptric laser scanner.

2. Description of Related Art

In the current manufacture of multilayer ceramic (MLC) substrates for integrated circuit semiconductor package structures, a plurality of green ceramic sheets is formed by a doctor blading a slurry containing a resin binder, a particulate ceramic material, solvents, and a plasticizer, drying the doctor bladed sheet and cutting it into appropriate sized sheets. Via holes are then mechanically punched for forming electrical interconnections through the sheet. Electrically conductive paste is deposited in the holes, and in appropriate patterns on the surface of the sheets, the sheets stacked and laminated, and the assembly subsequently fired at an appropriate sintering temperature. Punching the via holes in ceramic sheets presents formidable engineering problems in view of the small size, high density, and the complex patterns of the via holes. Apparatus used to perform these operations are described in IBM Technical Disclosure Bulletin (TDB) Vol. 13, No. 9, Feb. 13, 1971 P. 2536; IBM TDB Vol.16, No. 12, May 1974 P. 3933; IBM TDB Vol. 20. No. 4, September 1977, P.1379; and U.S. Pat. Nos. 4,425,829; 3,730,039; and 4,821,614, the disclosures of which are incorporated by reference herein.

The mechanical punching technology currently used to manufacture MLC substrates has several limitations. The aspect ratio of a hole should theoretically be no less than one, that is the diameter should not be less than the thickness of the sheet to be punched. As the miniaturization of electronic devices continues, the requirement that smaller via holes be used increases. A certain minimum sheet thickness is necessary, however, for the mechanical integrity of the structure.

In addition to requiring smaller diameter holes, future electronics devices will require that the holes be spaced closer together. Use of a mechanical punch at these geometries causes greatly increased embossing of the green sheet, which can greatly distort the via pattern.

High energy beams, including lasers, have been used to machine a variety of workpieces and this activity has been widely reported in the literature. Examples of using lasers to drill holes in electronic substrates are described in U.S. Pat. No. 4,544,442 and in U.S. Pat. No. 4,789,770. An apparatus combining laser machining with a mechanical punch is shown in U.S. Pat. No. 4,201,905.

A rotary metal removing operation such as reaming is not adaptable to extremely small hole diameters of high production rates, however. These types (small hole diameter or high production rates) of applications require a pulsed, high power laser which, if not accurately positioned, can improperly machine or ruin the workpiece. Because of this pulsing, it is not possible to use the beam to determine the machining position, since any possible damage will have already occurred by the time the position is determined. A low energy continuous laser, such as a HeNe laser, collinear with the high energy laser has been used to determine the position of the high energy laser. A control system which allows implementation of this idea is described in U.S. Pat. No. 3,902,036. Use of a similar control system for ophthalmic applications is described in U.S. Pat. No. 4,520,816.

A particularly useful apparatus and method for accurately and rapidly positioning and machining a workpiece comprising an electronic substrate is disclosed in U.S. Pat. No. 5,168,454, assigned to the assignee of this application. A low power HeNe laser is joined colinearly to the optical path of a high power pulsed Nd:YAG laser, and the collinear beam then scans one axis of the workpiece. The low power beam is partially split off to a location-determining device before final deflection of the beams to the workpiece. Deflection in the second axis is achieved by linearly moving the workpiece so that the beam will impinge upon the desired location of the workpiece.

Given the requirement for smaller and more closely spaced features in MLC substrates, a need exists for an apparatus and a method which use advanced technology to manufacture substrates with the required geometries. This apparatus and method must be able to accurately and rapidly machine features in these substrates in order to provide the necessary feature geometries and yet remain competitive with existing mechanical devices such as the multiple-punch apparatus described in U.S. Pat. No. 4,425,829.

A need also exists for an apparatus and method for verifying that the features machined in the workpiece are correctly located. Although a separate apparatus for performing this function has been previously described, for example in U.S. Pat. No. 4,555,798, a need exists for an apparatus and method which are capable of being integrated into the machining apparatus and method. Alignment of the optics in scanning systems are also critical, and many prior art systems are not practical for use in integrated machining systems.

Scanning systems using lasers are used in many applications. Laser scanners are part of a growing multi-billion dollar industry. For example, laser light could be scanned to drill holes in a semiconductor substrate to create microcircuitry, or it could be used to scribe alpha-numerics on a part or be used to read bar codes or used in laser printers.

The laser scanning systems can be basically classified into three types: Objective Scanners, Pre-Objective Scanners, and Post-Objective Scanners.

Objective Scanners 19, as shown in FIG. 1A and 1B, are the types of scanners which use a simple lens 10, to focus a beam of light 25, such as a laser beam 25, onto a workpiece or a part 12. The focused laser beam 25, is then scanned over the part 12, by moving the part 12, as shown in FIG. 1B. A major advantage of Objective Scanners is that the optics are less complex. Major disadvantages of Objective Scanners are their slower scan speeds and requirements of complex strategies to move the lens or the part.

Pre-Objective Scanners 29, as shown in FIG. 2, are the types of scanners that have a moving, mirrored surface 22, typically a galvanometer or a rotating mirrored polygon, which reflects the laser beam 25, into a lens 20. The lens 20, then focuses the laser beam 25, onto a part 12, at location 23.

When the mirrored surface changes its angle, mirrored surface 22', directs the laser beam 25, at a different angle and position into the lens 20. The lens 20, then focuses the beam 25, to another point 27, on the part 12, as can be clearly seen in FIG. 2. Generally, the lenses 20, in a Pre-Objective scanning system 29, are complex and expensive. Major advantages of Pre-Objective Scanners 29, are their high scan speeds and their ability to have a flat-field image. However, the major disadvantages of Pre-Objective Scanners 29, are that the lenses are very complex, the lenses are not telecentric (a telecentric lens allows the center for the scanned beam of light to impinge the work surface orthogonally throughout the scan) unless the lens is very large, the system is complex, color correction is very difficult and all these features make the system very expensive.

Post-Objective Scanners 39, as shown in FIGS. 3A (side view) and 3B (top view), are the types of scanners that have a moving mirrored surface 22, usually a galvanometer or a rotating mirrored polygon, after a focusing objective lens 30. The light or laser beam 25, after passing through a lens will also be referred to a light or laser beam 125. The laser beam 25, first passes through the lens 30, which starts to bring the laser beam 125, to a focus. The laser beam 125, is interrupted and reflected by the galvanometer or the mirrored surface 22, to focus on the surface of the part 12, at point 35. When the scanning mechanism changes its angle it redirects the focus of the beam 125, as illustrated in FIG. 3A, to either spot 33 or 37, on an imaginary curve or arc 31. The beam 125, is perfectly focused on the arc 31, but it is out of focus at points or spots 34 and 38, on the flat surface 32, of the workpiece or part 12. For the Post-Objective Scanner 39, in FIG. 3A, the laser beam 125, is folded by the galvanometer 22, 90 degrees in the X-Y plane, so that the laser beam focuses at point 35. When the galvanometer 22, scans the beam 125, it rotates about an axis 135, which lies in the center of the focusing beam 125, on the surface of the galvanometer 22, and in the direction of the Z-axis. The galvanometer 22, moves so that it intersects the laser beam 125, at an angle which is not 90 degrees in the X-Y plane. This causes the focused beam to scan along the arc 31. FIG. 3B, shows this Post-Objective Scanner 39, from a view that looks down on the scanned arc 31. Although the scanned arc 31, is out of focus at the edge of the scan it travels a straight path in the X-Z plane. Generally, the lenses 30, in a Post-Objective scanning system 39, are simple and inexpensive. Major advantages of Post-Objective scanners are their scan speeds, simplicity of the object lens, color correctability and their ability to be designed for more wavelengths. Major disadvantages include the fact that the image field is out of focus at the edges of the scanned field or not in focus throughout the scanned distance.

Bearing in mind the problems and deficiencies of the prior art, it is therefore an object of the present invention to provide an apparatus and a method that will provide an astigmatically corrected catadioptric laser scanner.

A further object of the invention is to provide a means for minimizing bow distortion, astigmatism, and field curvature resulting from a Post-Objective Scanner system.

It is yet another object of the present invention to provide a scanner system that uses very inexpensive lenses and mirrors.

It is a further object of this invention to provide a beam that is telecentric, i.e., the center of the focusing beam is perpendicular to the part at all points along the scan.

It is still yet another object of the invention to provide an optical system which is inexpensively adaptable to different wavelengths of light.

It is a further object of this invention to provide an optical scanning system in which the length of the scanned line is directly proportional to the angular change of the moving mirrored surface. This is the result that is sought for a so-called F-theta lens.

It is another object of the present invention to provide a method and apparatus for producing and machining microelectronic components and substrates with densely packed small feature connections.

It is a further object of the present invention to provide a method and apparatus for producing and machining microelectronic components and substrates which permits high throughput (productivity) and low defect rates.

It is yet another object of the present invention to provide a method and apparatus for producing and machining microelectronic components and substrates which may be utilized in "just-in-time" systems and is adaptable to meet future production and growth requirements.

It is still another object of the present invention to provide an improved method and apparatus for aligning, adjusting, tracking, controlling, and verifying machining in a system utilizing (laser) machining beams.

Still other objects and advantages of the invention will in part be obvious and will in part be apparent from the specification.

SUMMARY OF THE INVENTION

The above and other objects are achieved in the present invention which incorporates an improvement of the Post-Objective Scanner type and it is a fourth type of a scanning system for laser or other beam sources which will now be referred to as a Mid-Objective Scanner.

The present invention utilizes a novel method and an apparatus for a new astigmatically corrected catadioptric laser scanner, which method may be incorporated into a machining and tracking system.

Therefore, in one aspect that invention comprises a method for correcting astigmatism, bow distortion and field curvature comprising:

(a) at least one lens tilted at an angle alpha for focusing at least one incoming light beam onto at least one workpiece, (b) at least one scanning mechanism for interrupting and scanning the at least one incoming light beam, (c) the at least one scanning mechanism further directing the at least one incoming light beam onto at least a portion of the reflective surface of a concave cylindrical mirror, and (d) wherein the concave cylindrical mirror directing the at least one incoming light beam onto the workpiece, such that the at least one incoming light beam is focused at the workpiece.

In another aspect this invention comprises an apparatus for correcting astigmatism, bow distortion and field curvature comprising:

(a) at least one means for tilting at least one lens alpha degrees to focus at least one incoming light beam onto at least one workpiece, (b) a scanning mechanism located between the at least one tilted lens and the at least one workpiece, wherein the scanning mechanism has at least one means for directing the at least one incoming light beam onto at least a portion of the reflective surface of a concave cylindrical mirror, and (c) a means in the concave cylindrical mirror for directing the at least one incoming light beam onto a workpiece, such that the at least one incoming light beam is focused at the workpiece.

In yet another aspect this invention comprises an apparatus for correcting astigmatism, bow distortion and field curvature comprising:

(a) at least one toric lens to focus at least one incoming light beam onto at least one workpiece, (b) a scanning mechanism located between the at least one toric lens and the at least one workpiece, wherein the scanning mechanism has at least one means for directing the at least one incoming light beam onto at least a portion of the reflective surface of a concave cylindrical mirror, and (c) a means in the concave cylindrical mirror for directing the at least one incoming light beam onto a workpiece, such that the at least one incoming light beam is focused at the workpiece.

In still yet another aspect this invention comprises a method for correcting astigmatism, bow distortion and field curvature comprising:

(a) at least one toric lens for focusing at least one incoming light beam onto at least one workpiece, (b) at least one scanning mechanism for interrupting and scanning the at least one incoming light beam, (c) the at least one scanning mechanism further directing the at least one incoming light beam onto at least a portion of the reflective surface of a concave cylindrical mirror, and (d) wherein the concave cylindrical mirror directing the at least one incoming light beam onto the workpiece, such that the at least one incoming light beam is focused at the workpiece.

The Mid-Objective Scanner may be incorporated into a simplified, low cost optical delivery system for a high-powered machining (e.g., cutting) beam and a low powered tracking beam which utilizes unique alignment techniques and computer optical positioning control methods to provide a material processing instrument that achieves significant resolution (small feature size) and positional accuracy. The invention achieves a significant reduction in the overall cost of processing electronic components and substrates by: (a) reducing complexity and cost of direct hardware, (b) allowing an application to be programmable and therefore adaptable to product set changes in a "just-in-time" system by an integrated computer optical control system, and (c) allowing for adaptability for a range of (laser) beam sources by use of a simplified optical delivery path. The present invention removes the need for additional time and effort to produce and switch complex fixed masks for components to be machined. A single investment in capital machinery can be utilized for different material and workpiece sets and may allow for growth in future manufacturing requirements.

Therefore, in a further aspect, this invention provides a machining system comprising means for generating a machining beam; and means for generating a tracking beam, the tracking beam being separate from the machining beam. There is also provided a means for scanning the machining and tracking beams along an axis, the scanning means being movable and having at least one surface for reflecting said machining beam and for reflecting said tracking beam. Preferably the scanning means has a first surface for reflecting the machining beam and a second surface for reflecting the tracking beam, the first and second surfaces of the scanning means being fixed relative to each other.

Alternatively, the tracking beam is reflected by the same surface of the scanning means as the machining beam, but at a different angle of incidence. A workpiece holder secures a workpiece to receive the machining beam after reflection from the first surface of the scanning means. A detector receives the tracking beam after reflection from the second surface of the scanning means. A feedback control means then determines the position of the reflected tracking beam relative to the detector and controls and changes the firing rate of the machining beam as the machining beam is being scanned by determining the position of the machining beam relative to the workpiece based upon the position of the reflected tracking beam relative to the detector.

The machining system preferably utilizes the aforedescribed method and apparatus for correcting astigmatism, bow distortion and field curvature, and includes at least two concave cylindrical mirrors having curved reflective surfaces. The curvatures of the reflective surfaces of the concave cylindrical mirrors are substantially identical. One concave cylindrical mirror is positioned to interrupt the reflected machining beam and at least partially focus the machining beam at the workpiece. Another concave cylindrical mirror is positioned to interrupt the reflected tracking beam and at least partially focus the tracking beam on a grating before the detector. The scanning apparatus is preferably bidirectional, but may also be unidirectional.

In yet another aspect, the present invention relates to a method of controlling a machining system comprising the steps of:

(a) generating a machining beam having a variable firing rate;

(b) generating a tracking beam, the tracking beam being separate from the machining beam;

(c) providing means for scanning the machining and tracking beams along an axis, the scanning means being movable and having at least one surface for reflecting said machining beam and for reflecting said tracking beam;

(d) simultaneously scanning the machining and tracking beams with the scanning means;

(e) securing a workpiece to receive the machining beam after reflection from the first surface of the scanning means;

(f) detecting the tracking beam after reflection from the second surface of the scanning means;

(g) determining the position of the reflected tracking beam; and (h) controlling the firing rate of the machining beam as the machining beam is being scanned by determining the position of the machining beam relative to the workpiece based upon the detected position of the reflected tracking beam.

Preferably, in this aspect, the scanning means has a first surface for reflecting the machining beam and a second surface for reflecting the tracking beam, with the first and second surfaces being fixed relative to each other. Thus, in step (d) the machining beam is scanned by the first surface of the scanning means and the tracking beam is scanned by the second surface of the scanning means.

In another aspect, the present invention provides a method of controlling a machining system comprising the steps of:

(a) providing a desired design for machining a workpiece;

(b) converting the design into a graphic design format comprising pixels;

(c) sorting the pixels into a pseudo-raster format corresponding to at least one scan line across a portion of the design for the workpiece;

(d) generating a machining beam having a variable firing rate;

(e) generating a tracking beam, the tracking beam being separate from the machining beam;

(f) providing means for scanning the machining and tracking beams along an axis, the scanning means being movable and having at least one surface for reflecting the machining beam and the tracking beam;

(g) securing a workpiece to receive the machining beam after reflection from the scanning means;

(h) simultaneously scanning the machining and tracking beams with the scanning means, the machining beam being scanned along a scan axis across a portion of the workpiece;

(i) detecting the tracking beam after reflection from the second surface of the scanning means;

(j) determining the position of the reflected tracking beam;

(k) comparing the position of the reflected tracking beam with the scan line across a portion of the workpiece design; and (l) controlling the firing rate of the machining beam as the machining beam is being scanned by determining the position of the machining beam relative to the workpiece based upon the workpiece design scan line.

In a further aspect, the present invention relates to a method of aligning and adjusting a light beam-based machining system to improve optical performance parameters of telecentricity, angle of scanned beam line, location of line in which the scanned line resides, astigmatism or field curvature. The method comprises the steps of:

(a) providing means for generating a first, working beam;

(b) providing means for scanning the first beam along an axis, the scanning means being movable and having a surface for reflecting the beam;

(c) providing a holder for securing a workpiece or detector to receive the working beam after reflection from the surface of the scanning means;

(d) providing means for generating a second, alignment beam and transmitting the alignment beam in place of the working beam over the same path as the working beam;

(e) splitting the alignment beam into an object beam portion and a reference beam portion prior to scanning the alignment beam;

(f) providing an optically flat mirror in the holder in place of the workpiece or detector;

(g) scanning the object beam portion of the alignment beam across at least one axis across the optically flat mirror in the holder;

(h) reflecting the object beam portion of the alignment beam back from the mirror in the holder;

(i) generating an interference pattern between the reference beam portion and the reflected object beam portion; and (j) adjusting the scanning means based upon the interference pattern to improve optical performance parameters of the machining system.

The scanning means preferably is that described previously and may include a movable lens, a movable flat mirror, and a movable concave cylindrical mirror. The adjusting step may comprise moving some or all of the lens and flat and concave mirrors.

In yet another aspect, the invention relates to an apparatus for verifying machining operations comprising means for generating a machining beam and means for scanning the machining beam along an axis, as described previously. A workpiece holder is provided to secure a workpiece to receive the machining beam after scanning by the scanning means. A detector is located proximate the workpiece holder for detecting a plume generated by vaporization of material by the machining beam. Electronic control means verifies that the machining process end point has been achieved within the workpiece based upon the presence or absence of a plume detected by the detector. The associated method aspect comprises the steps of: (a) generating a machining beam; (b) scanning the machining beam along an axis over a workpiece; (c) detecting a plume generated by vaporization of material by the machining beam; and (d) verifying the progress of the machining process within the workpiece by electronic control means based upon the presence or absence of the plume. For example, a detected plume indicates further machining is required since material is still being removed by the machining beam.

In a further aspect, the present invention provides an apparatus for verifying machining operations on a workpiece comprising at least two different materials having different identifying spectra comprising means for generating a machining beam and means for scanning the machining beam along an axis. A workpiece holder is provided for securing the workpiece to receive the machining beam after scanning by the scanning means. A spectrometer is located proximate the workpiece holder for detecting identifying spectra generated by vaporization of different materials in the workpiece by the machining beam. Electronic control means verifies that the proper material interface has been reached (process end point) within the workpiece based upon the identification of spectra of the different materials in the workpiece detected by the spectrometer. The associated method aspect comprises the steps of: (a) generating a machining beam; (b) scanning the machining beam along an axis; (c) detecting identifying spectra generated by vaporization of different materials in said workpiece by the machining beam; and (d) verifying the position of the machining beam relative to the workpiece based upon the identification of spectra of the different materials in the workpiece.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
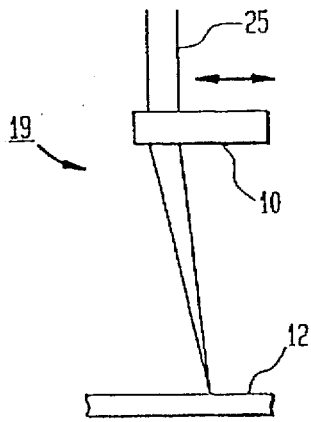
FIGS. 1A and 1B illustrate two typical prior art Objective Scanners.
Figure 1B:
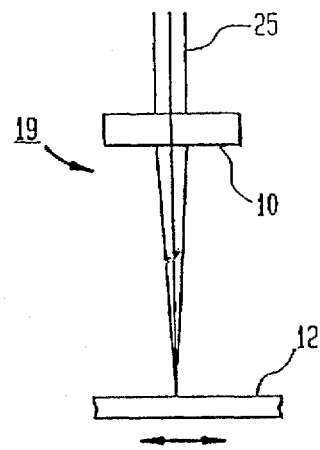
Figure 2:
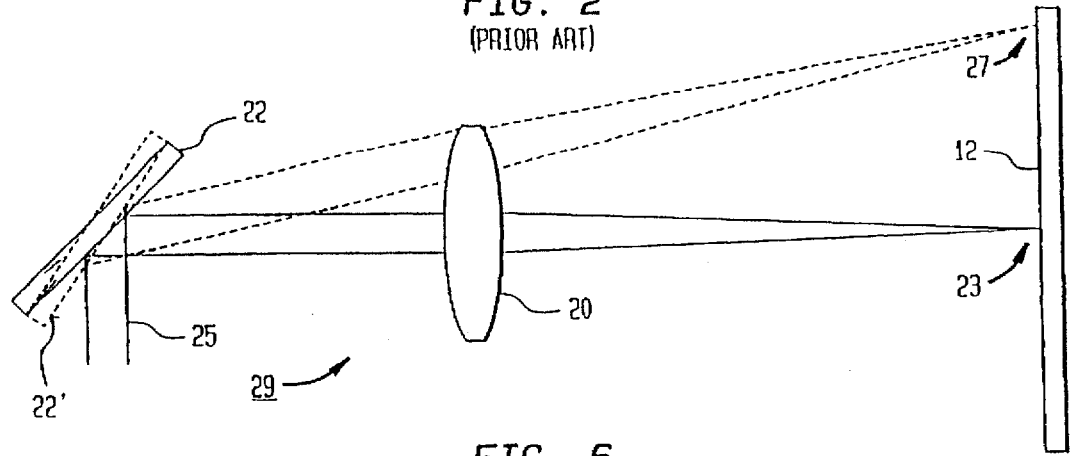
FIG. 2 illustrates a typical prior art Pre-Objective Scanner.

In describing the preferred embodiment of the present invention, reference will be made herein to FIGS. 1–15 of the drawings in which like numerals refer to like features of the invention. Features of tile invention are not necessarily shown to scale in the drawings.

MID-OBJECTIVE SCANNER

This invention relates more particularly to an astigmatically corrected catadioptric laser scanner or a Mid-Objective Laser Scanner system. A catadioptric system is a system that uses both reflection and refraction to achieve its focal power. While the relative powers of the lenses and mirrors vary from system to system, the use of the reflective surfaces to achieve most of the power, in combination with refractive surfaces of little or zero power, produces an image that has improved aberrational characteristics.

A lens as used herein means a single lens element or a plurality of lens elements. This invention may also utilize a lens that is achromatic so that multiple colors of light or multiple wavelengths of light could be used in the inventive Mid-Objective scanning system.

Referring back to FIGS. 3A and 3B, when a Post-Objective Scanner 39, scans the focused laser spot 35, on an imaginary line or curve 31, it swings the focus point or spot 35, in an arc or curve 31, which has radius of curvature, which radius of curvature is exactly the same distance from the center of the galvanometer 22, to the focus point 35, as shown in FIGS. 3A and 3B. This creates a deviation from a flat image plane which is called field curvature 36. Field curvature 36, is the distance between the arc 31, and the flat surface 32, of the part 12. As can be clearly seen in FIGS. 3A and 3B, the arc 31, is completely focused at point 35, however when the beam 125, is scanned in either direction to spot 33 or 37, beam 125, goes out of focus on the flat surface 32, of the part 12, as can be seen at point 34 and 38, respectively, on the part 12. A perfect scan would be if the focused spot 35 followed a straight scan line oil the flat surface 32 on the part 12 to properly scan the part 12.

Figure 4:
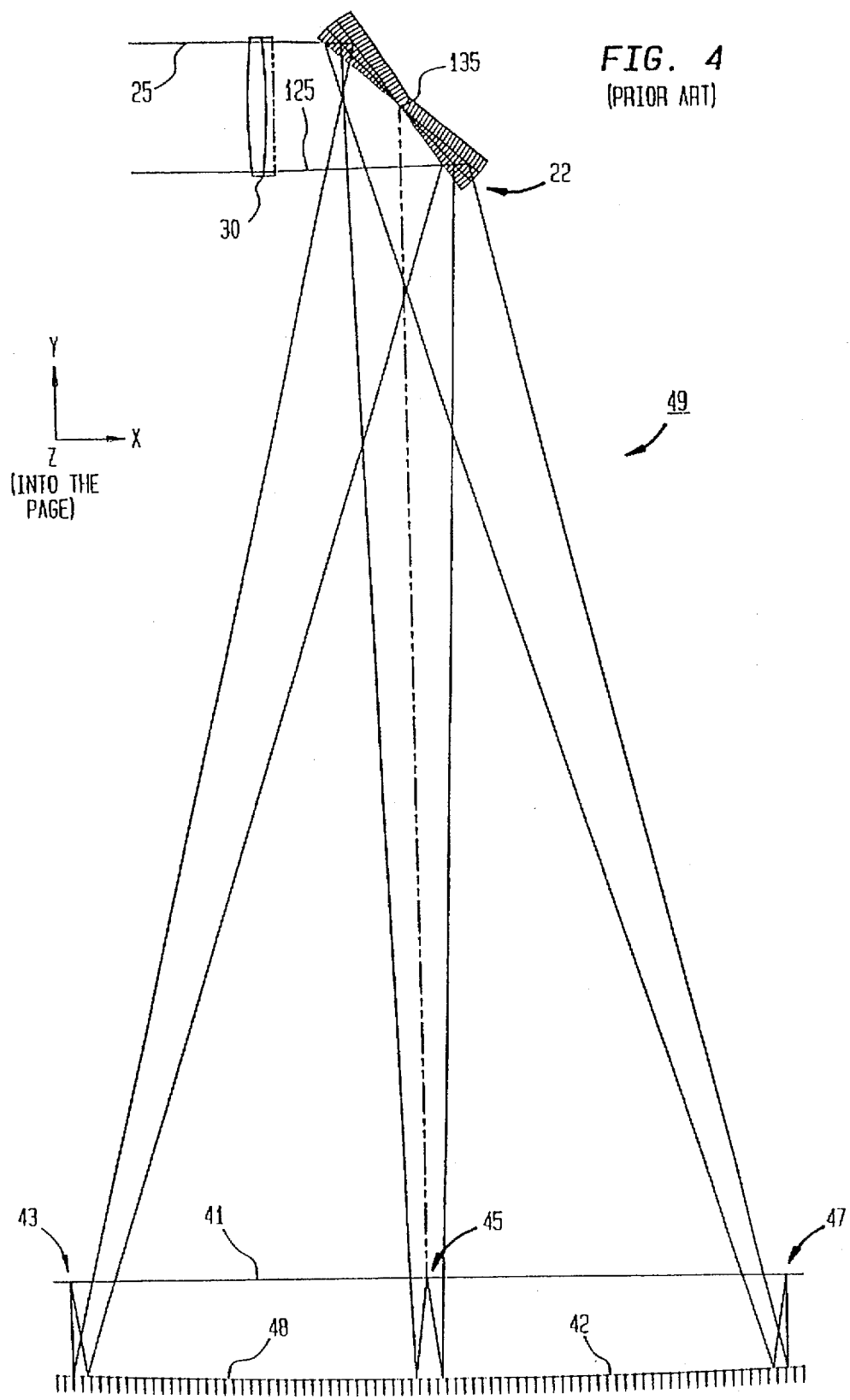
FIG. 4 illustrates a method to correct the field curvature of the prior art Post-Objective Scanner as shown in FIGS. 3A and 3B.

This field curvature 36, can be corrected using a Post-Objective Scanner 49, as shown in FIG. 4, by reflecting the scanned beam 125, off of a curved mirror 42, having a correct radius of curvature 48, as shown in FIG. 4. This creates a straight scan line or a flat image field 41, and as one can clearly see that focused points 43, 45 and 47, all are focusing on the imaginary image plane or field 41. However, this flat image plane 41, is not physically accessible because tile part 12, must lie between tile laser source and the curved mirror 42, and for most applications the laser beam 125, cannot generally pass through the part 12.

Figure 3A:
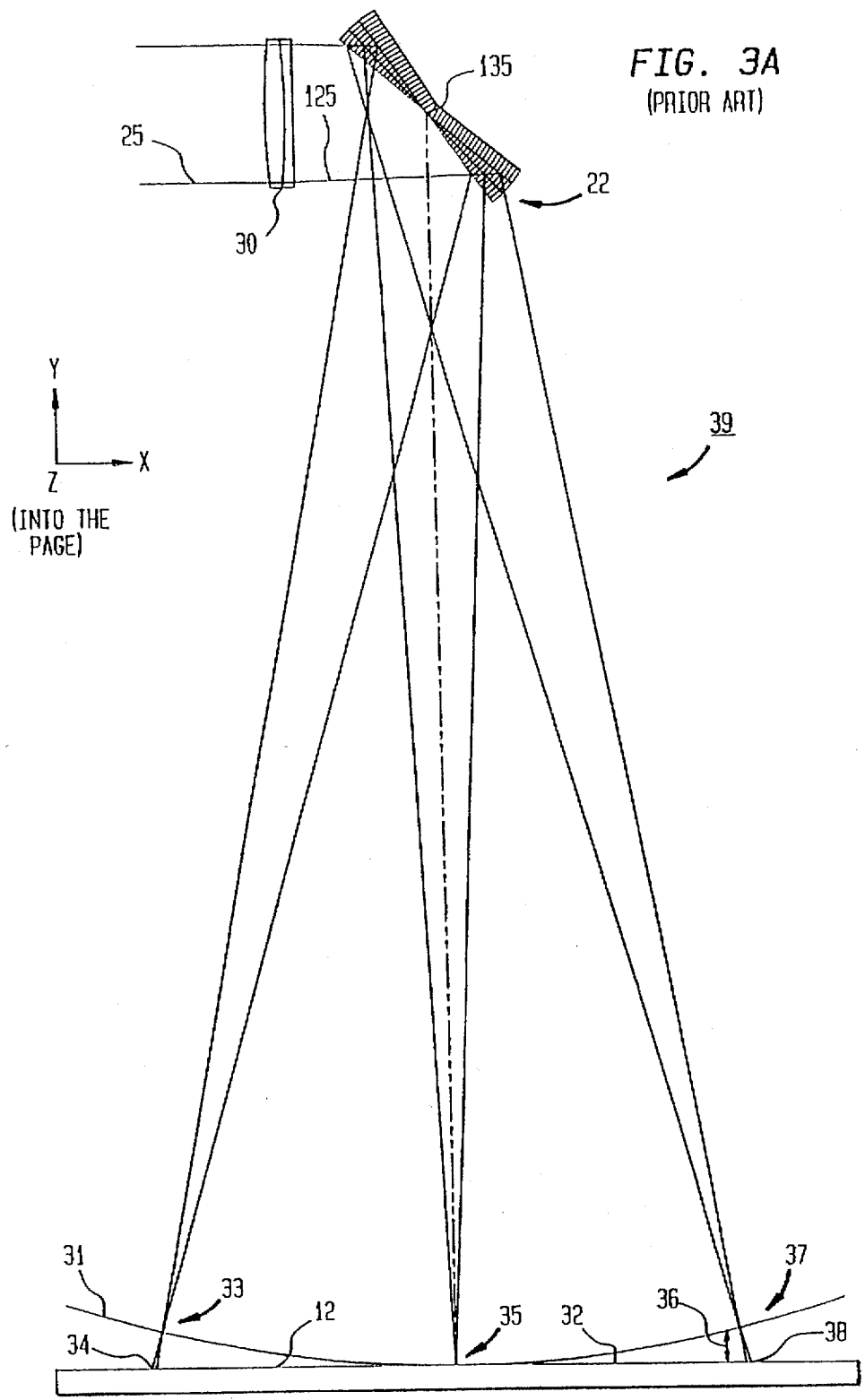
FIGS. 3A and 3B illustrate the side view and top view respectively of a typical prior art Post-Objective Scanner.
Figure 3B:
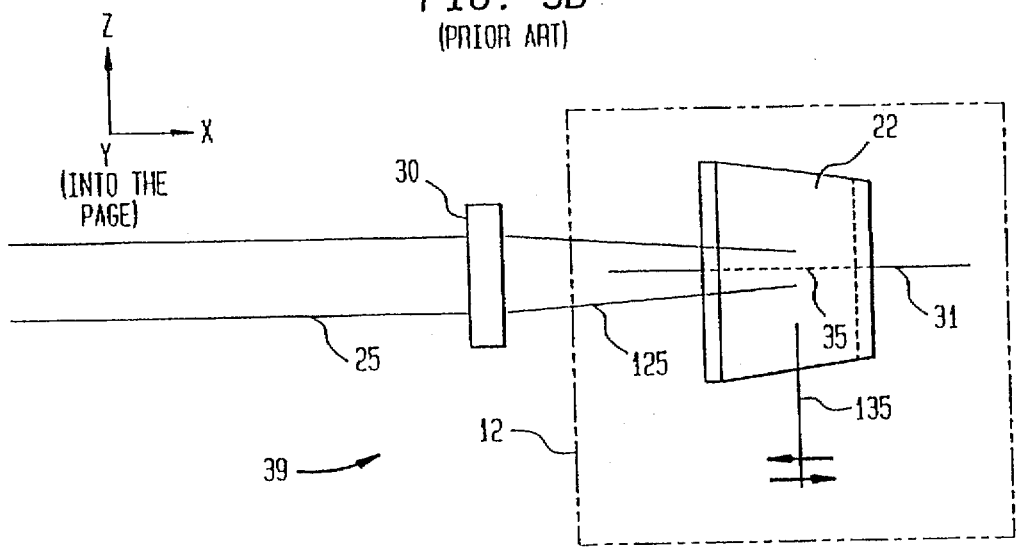
Figure 5B:
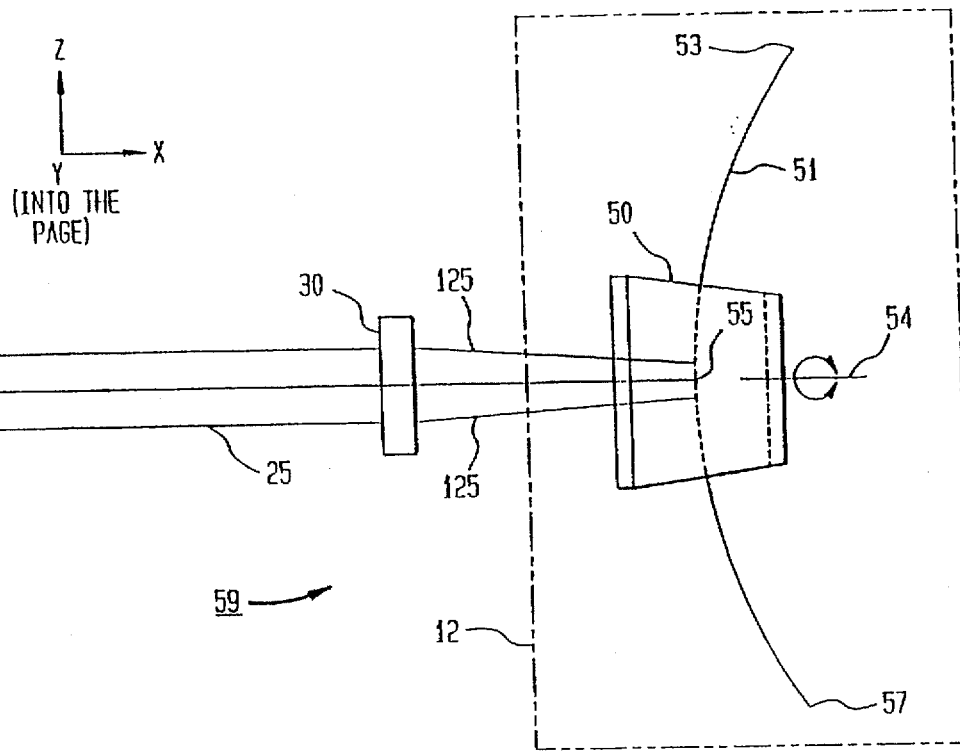
FIG. 5B illustrates the top view of the Post-Objective scanning system of FIG. 5A, in the X-Z plane.
Figure 5A:
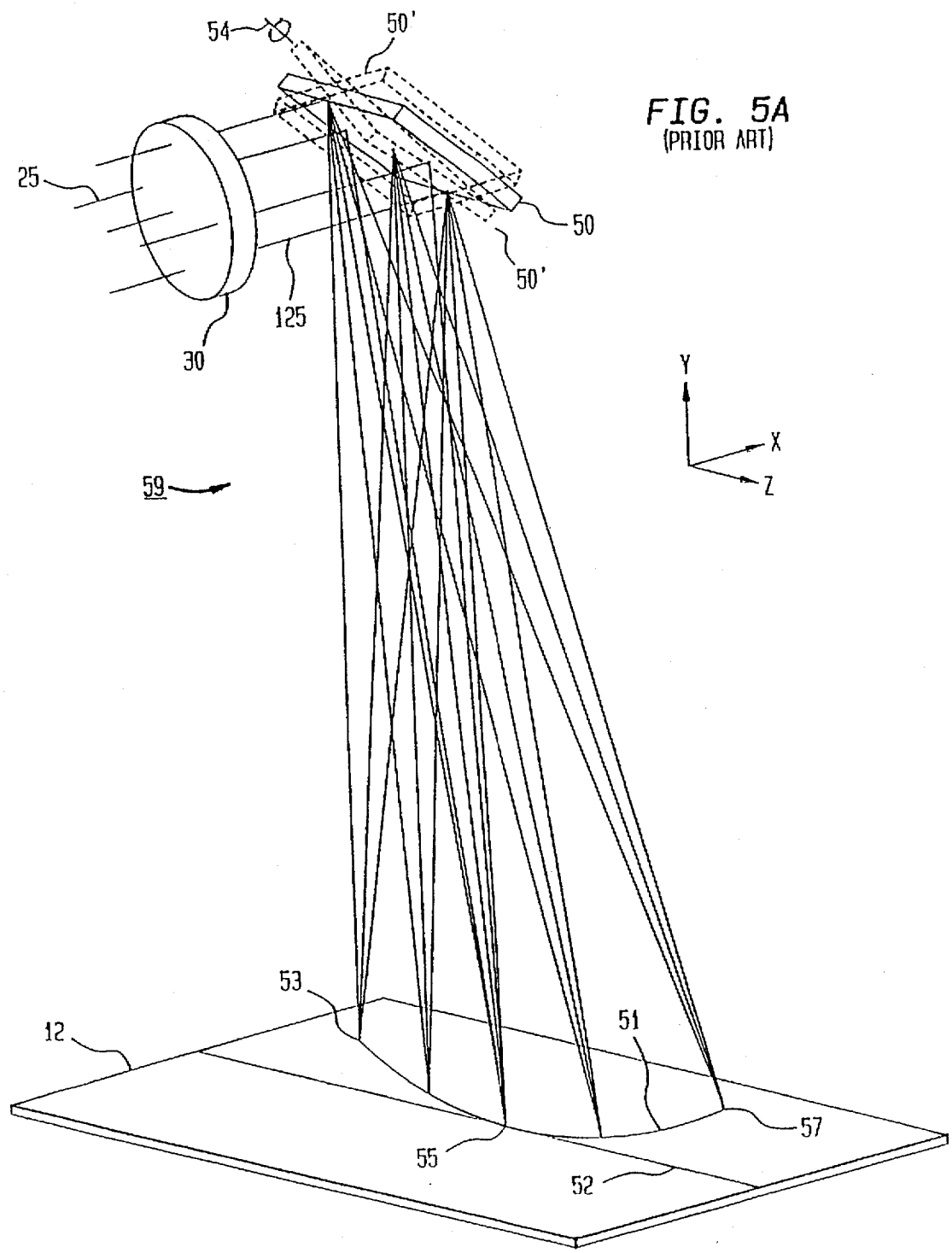
FIG. 5A illustrates field curvature and bow distortion induced by typical prior art Post-Objective Scanners.

As shown in FIGS. 5A (side view) and 5B (top view), when a Post-Objective Scanner 59, having a moving mirrored surface 50, 50', redirects the laser beam 125, at an angle of 90 degrees in the X-Y plane, but then scans the focused spot by rotating the galvanometer 50, about an axis 54. The path that the scanned spot takes 51, is not only curved out of focus from the flat part or workpiece 12, but is also curved away from the straight line 52. This deviation of the actual scan path from a straight line is called bow distortion. This bow distortion can be clearly seen in FIG. 5B, which is a view of the scanning system 59, as seen by looking directly at the work surface 12, through the galvanometer 50. The locus of focused spots not only lies on a curved surface in the X-Y plane (i.e., producing field curvature) the scanned line is curved in the X-Z plane (i.e., producing bow distortion). It should be noted that this bow distortion is not created when the galvanometer scans the focused spot or point in the X-Y plane as shown in FIGS. 3A and 3B.

One way to correct this bow distortion has been discussed in a paper by Victor J. Doherty of Eidolon Corporation, entitled "Correction Scheme for a Post-Objective Optical Scanner", Society of Photo-Optical Instrumentation Engineers, International Lens Design Conference, Vol. 554, Pages 247–251 (1985). In his scheme he discusses the use of a spherical mirror similar to that of 42, shown in FIG. 4, but tilted at a 45 degree angle to make the image plane accessible. However, this correction adds an aberration to the image called astigmatism.

Figure 6:
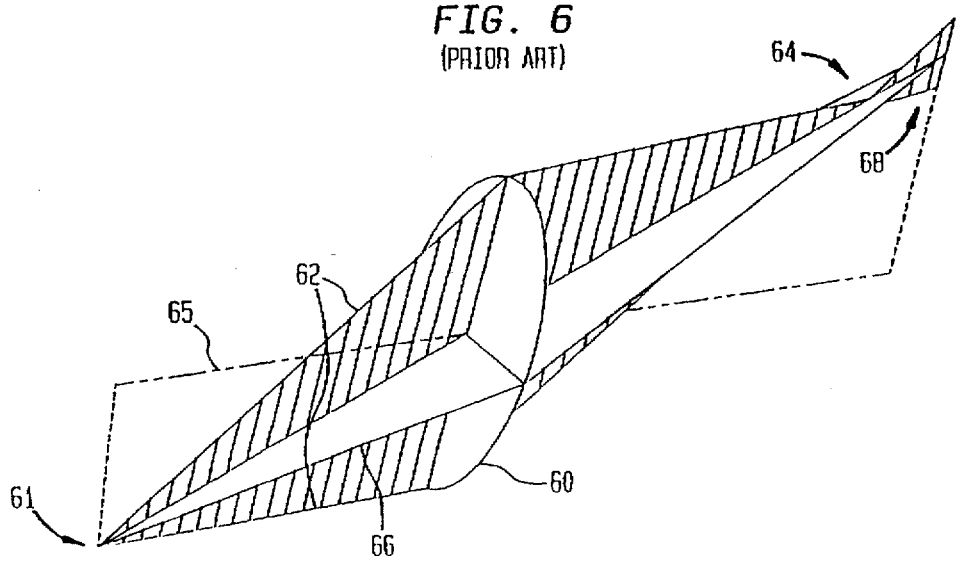
FIG. 6 illustrates astigmatism induced by a lens.

A typical example of astigmatism induced by a lens is illustrated in FIG. 6, where the lens aberration results in the tangential and sagittal image planes being separated axially, or where one axis of the focusing light beam comes to focus before the other axis. As shown in FIG. 6, in an optical system 60, having an object point 61, and optical axis 65, tangential fan of rays 62, come in focus at the tangential image or focal line 64, while the sagittal fan of rays 66, come in focus at the sagittal image or focal line 68.

In the Eidolon correction scheme the correction of the two aberrations was attempted by making the mirror toroidal, similar to that of mirror 42, as shown in FIG. 5A, instead of spherical, i.e., the folding mirror has different spherical curvatures in each axis. It has been seen that the toroidal mirror does not correct all of the bow distortion in the system, and it also does not correct all of the astigmatism. The Eidolon correction scheme basically offers a compromise between the correction of the two aberrations, i.e., one due to the bow distortion and the other due to astigmatism.

This invention provides a new method and apparatus to correct both the astigmatism and the bow distortion and also the field curvature.

Figure 7:
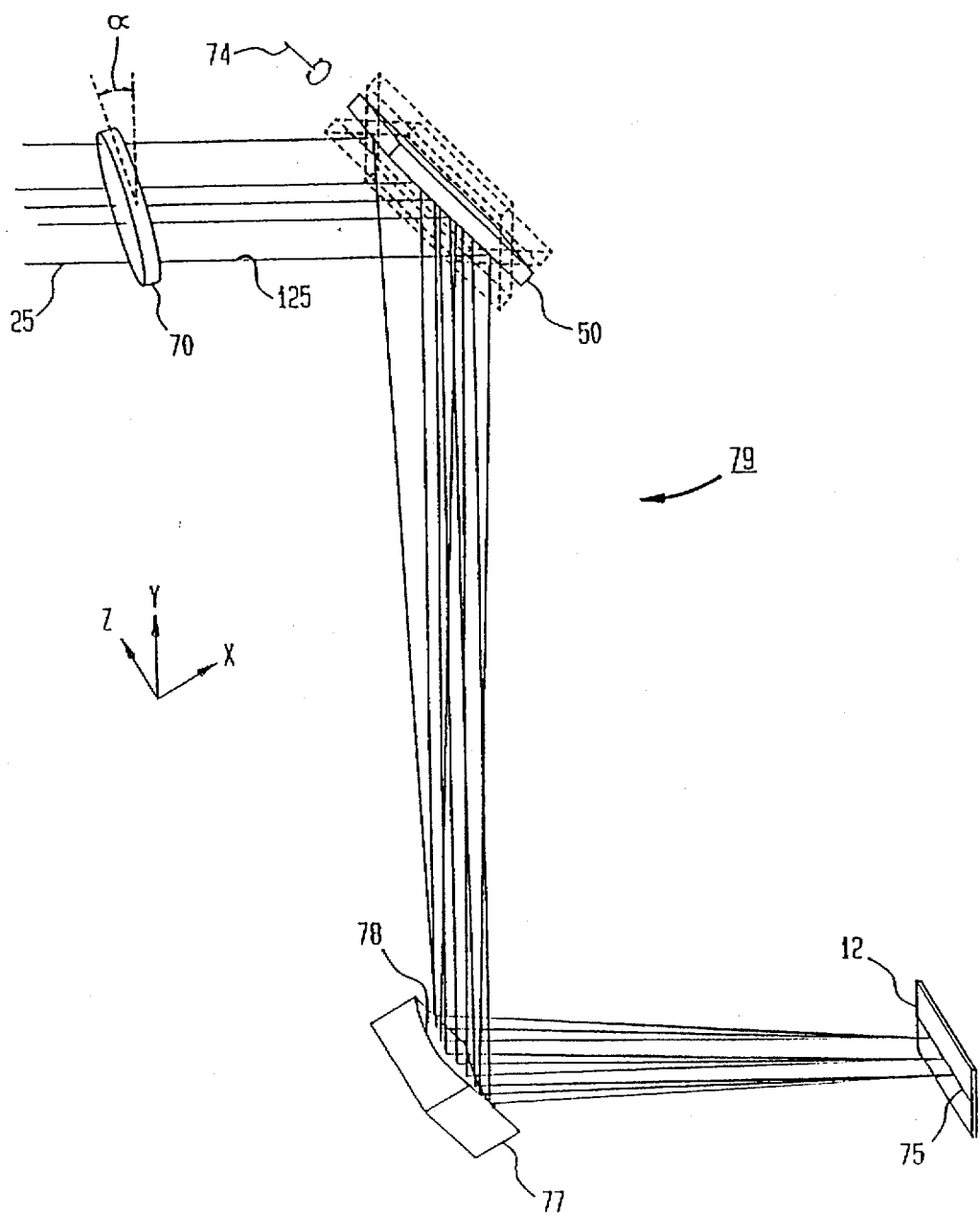
FIG. 7 illustrates a preferred embodiment of the invention.

The preferred embodiment of the invention is a Mid-Objective Scanner system 79, as shown in FIG. 7, which uses a simple refractive objective 70, which is tilted at an angle α relative to the optical axis, to begin to bring an incident laser beam 25, to focus. The beam 125, is interrupted by a scanning mechanism 50, such as a galvanometer or a rotating mirrored polygon, and is reflected 90 degrees by it in the X-Y plane. The galvanometer 50, scans the laser beam 125, by rotating about an axis 74.

Before the laser 125, comes to focus, the center of the laser beam in the center of the scan is again folded 90 degrees by a concave cylindrical mirror 77, having a radius of curvature 78, in the same plane that the galvanometer 50, folded the beam before, but it is folded in such a way as to redirect the laser 125, in the same propagation direction it had before it was folded by the galvanometer 50. The curvature of the concave cylindrical mirror 77, is typically tilted at a 45 degree angle in the X-Y plane, and is of a radius of curvature 78, that corrects the field curvature in the image plane 75.

By folding the beam 125, again in this way, bow distortion is again added to the system, but it is opposite to that of the bow distortion added by the galvanometer 50. Thus, the bow distortion cancels itself out and the image is free of it.

After the bow distortion has been corrected the only degrading aberration left in the system is astigmatism. This astigmatism is taken out of the image by adding the opposite amount of astigmatism in the first, simple, refractive objective 70. This is accomplished by tilting the lens 70, at an angle α, in the plane that the laser 125, is being folded (the X-Y plane) as shown more clearly in FIG. 7.

The amount or angle of the tilt α, is dependent upon several factors, such as, (a) the resolution of the system, measured by the numerical aperture, (b) the working distance from the reflective surface of the concave cylindrical mirror 77, to the workpiece 12, (c) the distance between the moving mirrored surface 50, and the reflective surface of the concave cylindrical mirror 77, (d) the distance between the lens 70, and the moving mirrored surface 50, and (e) the focal length of the lens or the refractive objective 70, that is used, to name a few.

Similarly, the radius of curvature 78, for the concave cylindrical mirror 77, depends on factors, such as, (a) the distance between the lens 70, and the moving mirrored surface 50, (b) the distance between the moving mirrored surface 50, and the reflective surface of the concave cylindrical mirror 77, and (c) the focal length of the lens 70, to name a few.

If the lens 70, is titled about its nodal point, (a nodal point is an imaginary point found for every lens), the focused image position will not move as the lens 70, is tilted. This will allow the continuous observation of the focused spot as the image quality is improved, much like watching a defocused image come in to focus. As the objective 70, is tilted, the laser beam 25, may be observed to identify the point at which the astigmatism is minimized.

Figure 8:
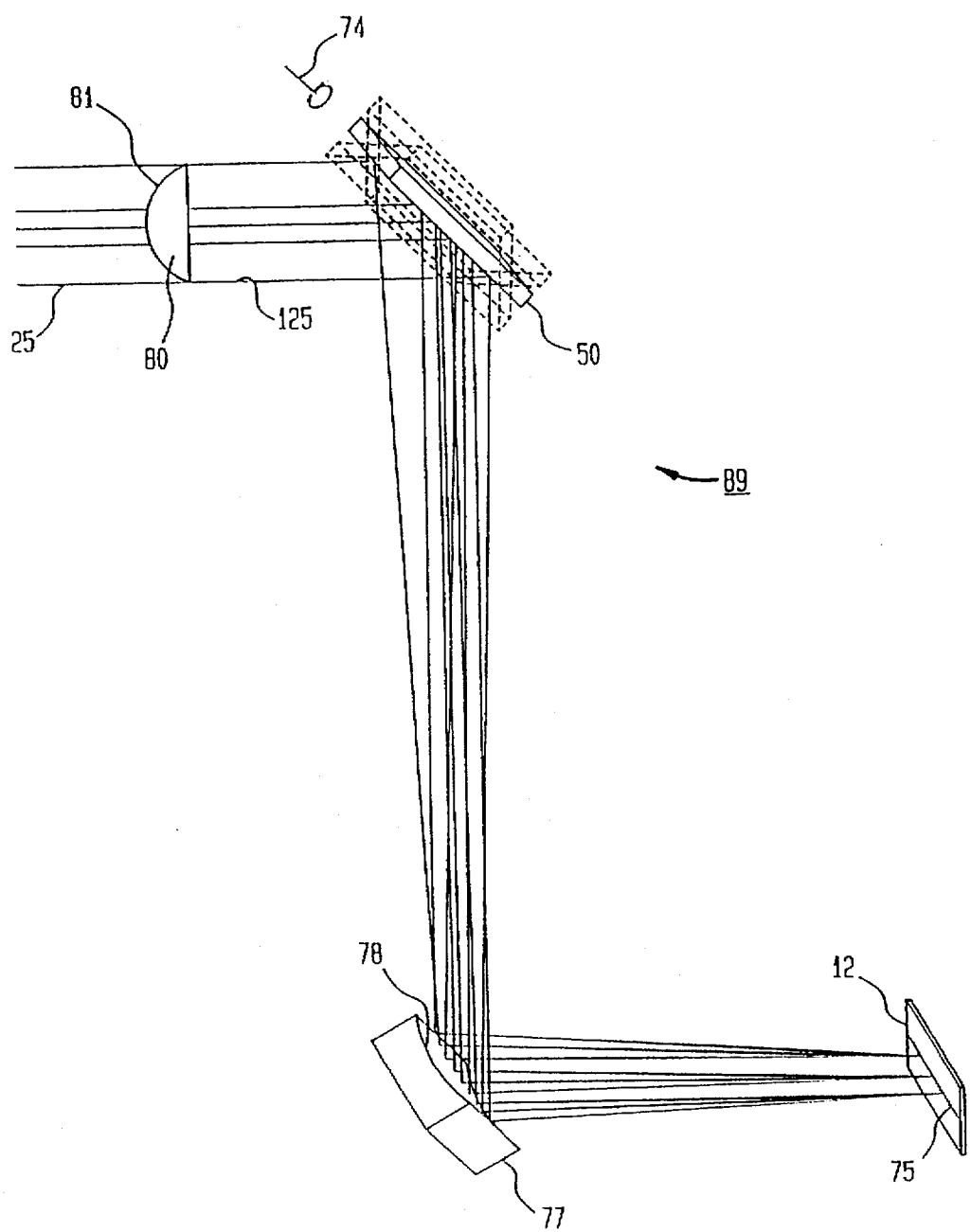
FIG. 8 illustrates another embodiment of the invention using a toric lens.

FIG. 8, illustrates another embodiment of an inventive Mid-Objective Scanner 89, using a toric lens 80. A toric lens is a lens which has a surface having a maximum power in one meridian and a minimum power in a perpendicular meridian. A toric lens is typically used to correct astigmatism. The Mid-Objective Scanner 89, would be a little more expensive to build than the Mid-Objective Scanner 79, because of the toric lens 80, however for some applications it might be desirable to have such a lens. Toric surface 81, of the toric lens 80, should produce the astigmatism that needs to be added or compensated, in order to obtain a flat image or line 75, at the surface of the workpiece 12.

The at least one incoming beam of light 25 or 125, could be a laser beam or it could be a collimated beam of light or other electromagnetic energy.

This apparatus and process called the Mid-Objective Scanner enables the use of a flat-field Post-Objective Scanner that is free from astigmatism and bow distortion. Additionally, the resulting scanned laser beam is a major improvement over currently, available technology.

This invention removes bow distortion, astigmatism, and field curvature. It uses very inexpensive lenses and mirrors.

It also provides a telecentric beam, i.e., a beam that when it is scanned the center of the beam is perpendicular to the part at all points along the scan. This invention also produces a scanned line in which the length of the scanned line is directly proportional to the scan angle of the moving surface 50. This is a condition that is strived for in a scanning system which is known as the F-theta condition.

One appropriate use or application for the Mid-Objective Scanner of this invention is to replace the optical scanning system in the MLDS Correction Scheme, which is a correction system invented at IBM Corporation and a subject of U.S. Pat. Ser. No. 5,168,454 (LaPlante, et al.), the disclosure of which is incorporated herein by reference. MLDS is a Trade Mark of IBM Corporation, Armonk, N.Y., USA. Because the Mid-Objective Scanner of this invention provides a telecentric lens system the holes that are drilled with the maskless laser drilling system (MLDS) of the above-mentioned U.S. Pat. No. 5,168,454, will all be uniform throughout the scan, i.e., the drilled holes will not have an angle or tilted edge walls as the distance from the center of the scan changes.

In a more preferred application in a material processing system, the Mid-Objective Scanner of this invention is utilized in connection with both a high energy cutting or machining beam and, unlike U.S. Pat. No. 5,168,454, a separate low energy tracking or positioning beam.

Machining and Tracking System

Figure 9:
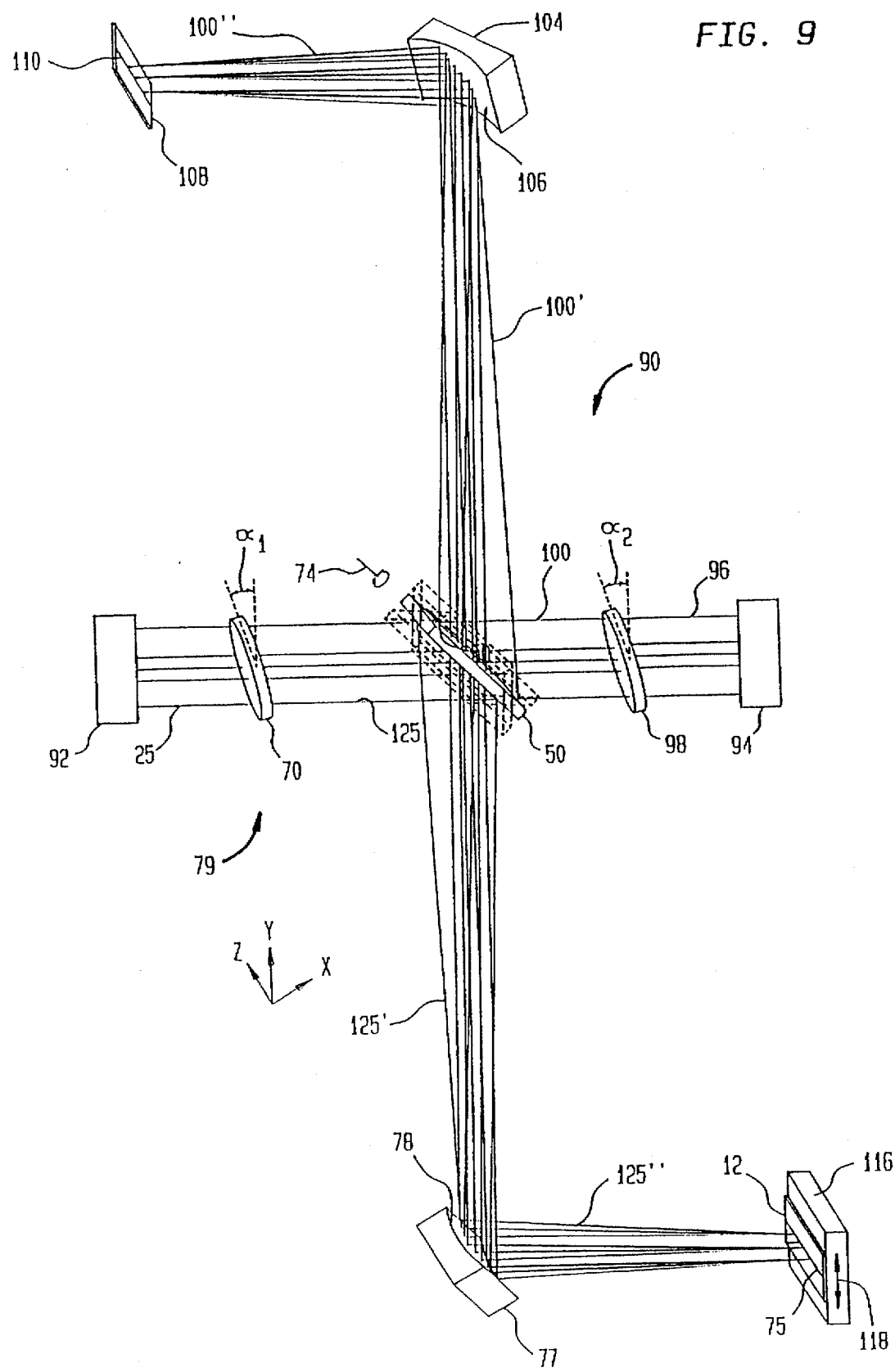
FIG. 9 illustrates a preferred embodiment of the machining and tracking system of the present invention.

Referring to the drawings in more detail and particularly referring to FIG. 9, there is shown the preferred machining apparatus according to the present invention. The described apparatus and method can be used to machine holes in a substrate and features other than holes, for example, slots, as described in U.S. Pat. No. 5,168,454. As used herein (and unless otherwise indicated), the term "machining" is intended to encompass all types of material processing or removal, either partial of through the workpiece, including cutting, drilling, heating, heat treating, material deposition, exposing photosensitive emulsion, and the like. The machining apparatus includes a means for generating a high energy machining beam of pulsed or continuous nature and a means for generating a low energy positioning and verifying beam. For the purposes of the present invention, the source of the preferred high energy beam is a Nd:YAG laser 92 and the source of the preferred,low energy beam is HeNe laser 94. As for the case of exposing photosensitive emulsion, the machining beam could consist of a modulated low energy laser beam such as that from a HeNe or Argon-Ion Laser. It should be understood, of course, that this choice of lasers is not meant to be exhaustive as there are other combinations of lasers and beams which will adequately fulfill the objects of the present invention, including multiple lasers suitably multiplexed.

The Nd:YAG laser 92 produces a beam 25 with a wavelength of 0.532 microns and a diameter of approximately 1 mm. The beam 25 is pulsed, typically at a rate of 1000–2000 Hz, and has an average power in the range of approximately 3–10 W. After exiting the Nd:YAG laser 10 the beam 25 may pass through an expander (not shown) which performs a collimating function to maintain the parallelism of the beam. The HeNe laser 94 produces a beam 96 with a wavelength of 0.5435 microns and a diameter of approximately 1 mm. The beam 96 is continuously powered with a power in the range of approximately 1–5 mw. The HeNe beam 96 also may pass through an expander (not shown) which performs a similar function for the HeNe beam as an expander would perform for the Nd:YAG beam.

The method and apparatus of delivery of the high energy laser beam 25 to the workpiece 12 is the same system 79 as that previously described for the Mid-Objective Scanner of this invention. Instead of the refractive objective lens 70 tiltable at angle $\alpha_1$ shown in FIG. 9, one may employ the toric lens 80 shown in FIG. 8 or other suitable focusing device to produce partially focused beam 125. Beam 125 strikes first surface 101 of galvanometer 50 (FIG. 10) at angle $\beta$ and is reflected off at angle $\beta$ as beam 125'. After being reflected off concave cylindrical mirror 77, high energy beam 125" is focused and impinges workpiece 12 along image plane axis 75.

Also provided is a means for translating workpiece 12 along a second axis. This translation means shown is translation table 116 which moves along an axis 118 as indicated by the arrows in a direction which is orthogonal (i.e., perpendicular or normal) to the scan axis 75.

To be able to machine a variety of workpiece 12 materials, it is desirable to be able to modify the wavelength of the machining beam 25. This may be done by methods known in the art. A wavelength of 1.06 µm is suitable for machining materials such as ceramic green sheets for electronic substrates. A 0.266 µm machining beam is of particular importance in the machining important insulating coating for electronic substrates. It can also be used to machine other dielectric materials such as Teflon, epoxy fiberglass, or other polymeric materials.

Figure 10:
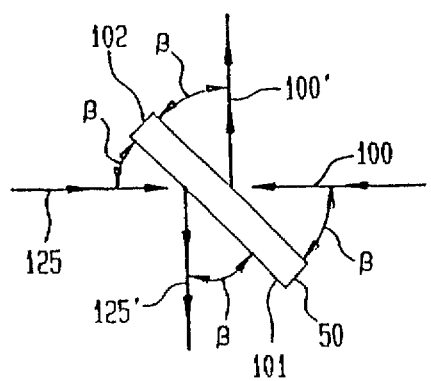
FIG. 10 illustrates a side view of a galvanometer used in the preferred machining and tracking system of FIG. 9.

Next, the machining apparatus includes a method and apparatus 90 for tracking the high energy cutting or machining beam with a low energy positioning and verifying beam 96. The tracking apparatus employs a Mid-Objective Scanner as previously described, but in a "mirror image" configuration. The tracking system portion of the invention uses a common scanner with the machining portion of the invention. Tracking beam 96 passes through refractive objective lens 98 (optionally, a toric lens or other focusing device) tiltable at angle $\alpha_2$ and partially focused beam 100 then strikes surface 102 of galvanometer 50 at angle $\beta$ (FIG. 10). Surface 101 for high energy beam 125 is on the opposite side of flat galvanometer 50 as surface 102 for low energy beam 100. Since the laser sources 92 and 94 are fixed, and surfaces 101 and 102 are fixed relative to each other, scanning movement of galvanometer 50 will produce movement to tracking beam 100' identical to machining beam 125'. Preferably, laser sources 92 and 94 are initially aligned relative to each other so that emitted beams 25 and 96, respectively, are collinear or coaxial. When the emitted beams 96 and 125 are collinear, or at least parallel to each other, the axes of reflected beams 100' and 125' will be parallel to each other.

Galvanometer 50 permits bidirectional scanning, i.e., scanning of a beam on a workpiece from one end of a scan axis to the other end, and then retracing the scan axis from the second end back again to the first end. In this manner, machining, cutting or other processing may be performed without interruption while waiting for the scanner to relocate the beam back to the first end of the scan axis.

Figure 11:
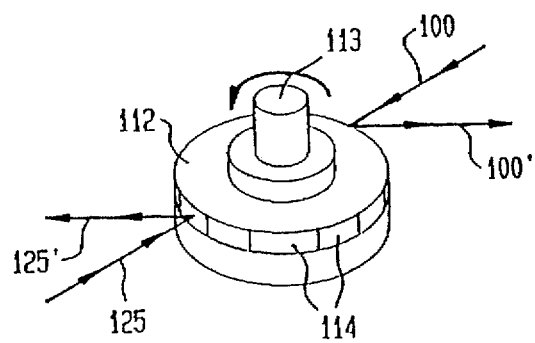
FIG. 11 illustrates a perspective view of a rotating polygonal mirror which may be used in the machining and tracking system of FIG. 9.

As shown in FIG. 11, another scanning means which may be employed in place of galvanometer 50 is a rotating polygonal mirror 112. When rotating about axis 113 as indicated, the polygonal mirror acts as a unidirectional scanner, i.e., the incoming high energy beam 125 which reflects off mirror segment 114 as beam 125' impinges the workpiece 12 at one end of the scan axis and moves in one direction. When the incoming beam reaches the end of one mirror segment, the beam then again impinges on the same end of the scan axis with the previous mirror segment and again moves in the same direction. Thus the beam does not retrace the original scan, as in scanning system utilizing the bidirectional galvanometer, 50 shown in FIG. 9. In the present invention, the bidirectional scanner is preferred. As shown in FIG. 11, incoming tracking beam 100 impinges an opposite mirror segment 114 and reflects off as beam 100'. When employed with a polygonal mirror having an even number of sides, each of incoming beams 100, 125 and reflected beams 100', 125' will be parallel. However, there is no requirement to use an even number of sides in a rotating polygon or to use a two sided galvanometer mirror since the machining and tracking beams need not be opposite in direction. The tracking beam may even be reflected by the same face of the scanner as the machining beam, but at a different angle of incidence.

After being reflected by surface 102 of galvanometer 50, and before it comes into focus, the center of tracking beam 100' at the center of the scan is then folded 90 degrees by concave cylindrical mirror 104. The radius of curvature 106 of concave mirror 104 is the same as that of concave cylindrical mirror 77. The tracking beam is folded in such a way as to redirect beam 100' in the same propagation direction it had before it was folded by the galvanometer 50. As reflected by mirror 104, tracking beam 100" is corrected for bow distortion added by galvanometer 50. The curvature of the concave cylindrical mirror 104 is typically tilted at a 45 degree angle in the X-Z plane, and is of a radius of curvature 106 that also corrects the field curvature of focused beam 100" on the image plane 110 on detector 108.

Figure 12:
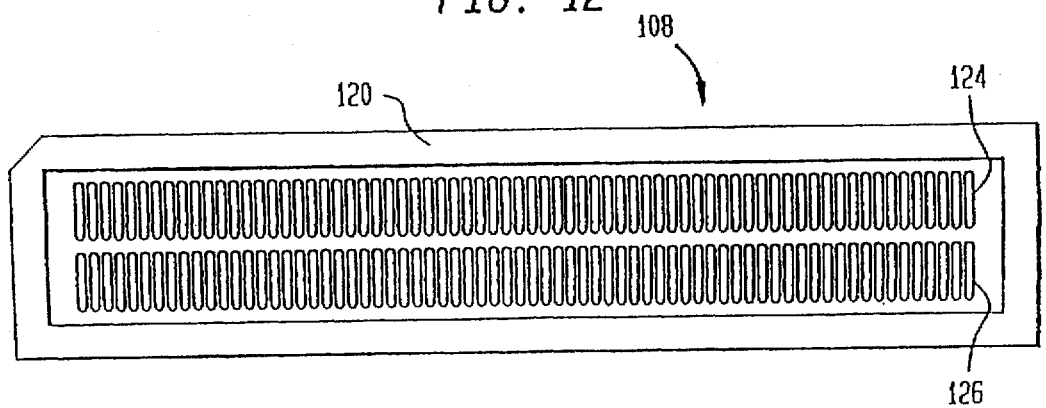
FIG. 12 illustrates a front elevational view of the grating of the photodetector used in the preferred machining and tracking system of FIG. 9.

Photodetector 108 shown includes a flat glass plate or grating 120, as seen in FIG. 12. Chromium lines are shown as being applied to the surface of the plate in two different uniform patterns—an upper pattern 124 of thinner and more closely spaced vertical lines of, for example, 0.015 mm width and 0.015 mm spacing, and a lower pattern 126 of thicker and more widely spaced vertical lines of, for example, 0.020 mm width and 0.020 mm spacing. However, only one of the pattern sets is needed for detection purposes. The tracking beam 100" passing through grating 120 is detected as an on/off signal by a photoelectric device located behind the grating, such as a charge-coupled device (CCD), and is counted and analyzed, as will be discussed further below.

As discussed previously in connection with lens 70, to adjust and correct for astigmatism, lens 98 may be tilted about its nodal point to an angle $\alpha$ while observing the interferogram of the focused beam 125" on the plane of detector 108 until the astigmatism is minimized.

Figure 13:
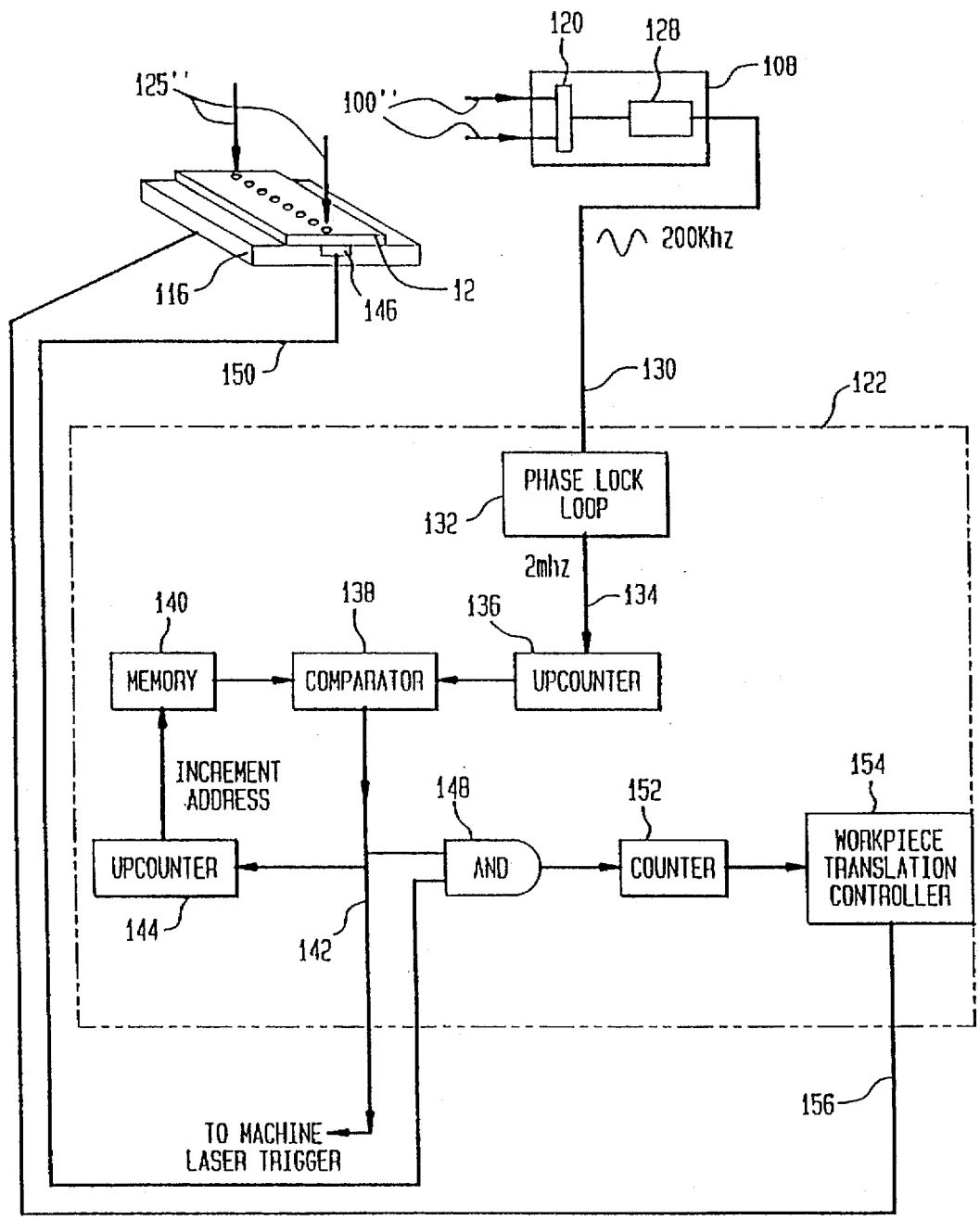
FIG. 13 is a block diagram illustrating the control system used in the preferred machining and tracking system of FIG. 9.

To determine the location at which the high energy machining beam will impinge upon the workpiece and control positioning of the high energy machining beam, position of the low energy tracking beam is determined using photodetector unit 108, which includes detector grating 120 and computer 122. Finally, as shown in FIG. 13, the machining apparatus comprises an in-process means for verifying the machining process end point of the machining operation. This verifying means may include a photometric, acoustic, mechanical or spectrographic detection system in conjunction with computer 122.

Tracking and Positioning Control System

The present invention is intended to be utilized with a maskless system which relies upon stored machining information rather than a physical mask placed over the workpiece to direct the machining beam to process (e.g., drill) the workpiece at desired locations.

In the present invention, scanning HeNe tracking beam 100" impinges upon the detector grating 120 of photodetector 108, creating a signal which is analyzed by an electronic circuit in a device such as a personal computer 122. By comparing the position of the positioning beam 100" at a given instant with a desired machining location on the workpiece 12, the computer can determine when to pulse the machining laser 92, as will be explained in more detail hereafter.

Referring to FIG. 13, the method and apparatus which performs this position tracking and control function is described in more detail. The scanning positioning beam 100" enters the front cavity of the photodetector unit 108 and passes through a grating 120 before impinging upon a photoelectric device 128. This creates an approximately sinusoidal signal 130 at a frequency of approximately 200 khz which corresponds to a sequence of discrete positions in the first axis 110 across which the tracking beam 100" scans. The 200 khz signal is processed in a phase lock loop 132, creating a 2 Mhz signal 134. This provides ten increments for each one incrementation, the grating giving a 10× accuracy improvement. This signal 134 is the input to an upcounter 136, the output of which is compared by comparator 138 with a binary number, corresponding with the desired machining location, previously loaded into memory 140. When the upcounter 136 output matches the number in memory 140 the comparator 138 will produce an output 142 which triggers the Nd:YAG machining laser, which will then fire, so that the machining beam 125" impinges upon the workpiece 12 in the proper location. The output 142 of the comparator 138 is also an input to upcounter 144, which then sends an increment address signal to memory 140, causing it to load the binary number corresponding to the next desired machining location.

Galvanometer 50 may scan at a constant frequency of, for example, 18 Hz. The machining Nd:YAG laser source 92 may have a variable firing rate of, for example 0–2000 Hz. Changing the timing of the machining laser firing rate, i.e., controlling when it will fire the next pulse, changes the location of impingement of the next beam pulse along scan axis 75 on workpiece 12. By utilizing the closed loop system previously described, accurate machining may be performed on the workpiece, for example, within a positioning accuracy of 2 µm.

Workpiece 12 can be translated along the second axis, which is orthogonal to the first axis 75, by a mechanical device, for example, translation table 116. This translation can be performed after a pre-determined number of pulses have been fired by the Nd:YAG machining laser or after a verifying device has determined that the appropriate features have been machined along the first axis 75 for a given location on the second axis 118. This verifying device is preferably an integral part of the laser machining system, but can also be a separate device. By scanning the high energy machining beam and the low energy positioning and verifying beam along the first axis 75 and then translating the workpiece 12 along the second axis 118 whereafter the scanning along the first axis 75 is repeated, the workpiece 12 can thus be scanned and machined in a raster-like fashion. The preferred embodiment shown in the drawings incorporates the verifier into the machining system.

Verifying System

The block diagram of FIG. 13 also depicts the operation of one embodiment of a verifier for the machining system of the present invention. When a hole or other feature is machined in workpiece 12, machining beam 125" impinges upon the strip photodetector 146. Machining beam, 125, can be composed of a high power pulsed laser, 92, and a low power CW laser coaxial with the pulsed laser to provide a continuous low power verifying beam. In this preferred embodiment the photodetector is located beneath the workpiece, but it can be located elsewhere, with the beam 125" impinging on it through suitable reflective means (not shown). This may be essential if a particular machining operation does not require features to be machined through the thickness of the workpiece 12.

The output signal pulse 150 of the photodetector strip 146, which indicates that the beam, 125, has passed through the workpiece, is then an input to an AND device 148, along with the output 142 of comparator 138, which is high when the beam is at the correct feature position. If these two signals 142, 150 correspond, the AND device will have an output, verifying that a feature has been machined in a proper location.

Several features will typically be required to be machined along the first axis 75 for a given location of the second axis. As the machining beam 125" proceeds along the first axis 75, verifying the machining of each desired feature as described above, the output of the AND device 148 is stored in counter 152. The required number of machining operations for this location of the second axis is input from the memory 140 into the counter 152. When the actual number of operations is equal to the required number of operations, the counter 152 activates the workpiece translation controller 154, which sends a signal 156 to activate the translation table 116, moving the workpiece 12 to the next position along the second axis 118.

Figure 14:
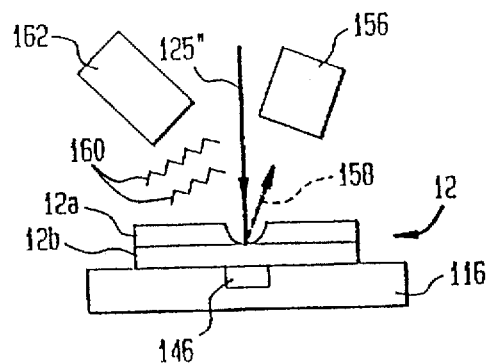
FIG. 14 illustrates a side elevational view of a workpiece, workpiece holder and verifying apparatus useful in the preferred machining and tracking system of FIG. 9.

Other verification methods and apparatus are depicted in FIG. 14. Alternatively, verification of the end point of the desired machining process can be made through other visual adaptive monitoring methods such as analysis of the spectra of laser induced plasma from the workpiece. The workpiece 12 may be made up of different materials 12a, 12b which have different spectral lines associated with their plasma. A change of spectral signature 158 in the plasma or other emission generated by the laser machining (e.g., cutting or drilling) of beam 125" or of the low power coaxial laser, would indicate that the machining has proceeded to the interface between different materials. This information, as determined by spectrometer 156 placed proximate the workpiece 12 and holder 116, could be then fed back to the computer 122. Also, a photocell detector 162 for plume 160 generated by vaporization of material by the machining process may be placed in the vicinity of the workpiece 12. Alternatively, the plume may be detected by obscuration of a reference beam. Determining the presence of a plume 160 would indicate that the machining (e.g., drilling) process was not yet completed. Determining the absence of a plume would indicate that the machining process has been completed. This information could be then fed back to the computer 112.

In the verifying methods described previously, the same laser firing circuit card within computer 122 which performs the pulsing of the machining beam could be used to determine the position of the machining beam in relation to the part. Simple logic may be used to switch appropriate signals to and from the card.

Design Data Translation System

As part of the maskless positioning system described previously, the present invention incorporates a user-friendly input to specify process parameters required for design data preparation. Parameters such as pixel pitch and laser max repetition rates are provided for input. This input is also compatible with the data exchange format (DXF) and tag image file format (TIFF), recognized as industry standards, to facilitate input by numerous commercially available computer-aided design (CAD) and business graphics application software packages.

The first subsystem for data translation generates pixels for producing graphic primitives of the desired machining design. Conventional, well-known algorithms are employed to generate pixels corresponding to the area to be machined. These pixels are typically tailored for microelectronic design applications, but may also include other applications. For example, circles of identical diameter often re-occur throughout a ceramic package design. These circles may function as pads, vias, and the like, and are required by the design to be identical, except for the location of the center. When pixels for a circle are generated, a 45° arc segment is stored in memory. Pixels for an identically sized circle at another location can be generated by simply adding fixed offsets to the X-Y coordinates of the 45° arc segment. The pixels along the remainder of the circumference are obtained by simply negating and/or transposing the X and Y elements. Line width may also be stored and utilized, as well as smooth corners.

Conventional methods may be used to rotate, translate, reflect, step-and-repeat, magnify and/or shrink desired machining designs.

The second subsystem employed sorts the pixels into pseudo-raster lines by conventional methods. In the case of a TIFF data file, the pixels are predefined and presorted to a great extent, but use of some portions of the two subsystems described herein may still be required. Since pixels may be generated so as to be pre-sorted for a given design primitive, a conventional sorting algorithm for such partially stored lists may be employed. It is desirable to utilize at least partially presorted pixels to shorten and improve system execution time. Scan lines may also be compressed by combining the pixels of two or more scan lines located within a predefined interval into one scan line containing both sets of pixels to increase throughput.

Once the pseudo-raster lines of pixel and scan line information are generated, these may be stored in memory 140 of computer 122 and utilized to control the positioning of machining beam 125" on workpiece 12 as described above.

The preferred embodiment of the MLDS post processor program begins by accepting input files in industry standard format. The end-user may specify one or more of these, and they may be specified interactively or in a "batch" mode. Input files describe the shapes of the features and their locations in the desired design to be machined. After the input file is entered, the program computes the pixels location for each shape. For example, all of the pixels around the circumference of a circle must be computed, given its center and radius. After the pixels are calculated, they are sorted into scan lines so the machining beam can expose (machine) the substrate on a line-by-line basis.

The input files do not, in general, present shapes in any predictable order. Furthermore, the pixels computed for each feature may overlap, in terms of scan lines, with pixels from another feature, thus necessitating the sort step. The final output is a file sorted into lines. Each line is in turn "sub-sorted" into an order that the machining beam can optimally expose. The final output file does not resemble any industry-standard graphics file.

Interference Alignment System

To measure accurately optical performance parameters of scanning system 79 and 90, and to align the various components thereof, the present invention may utilize in place of or in addition to laser sources 92, 94 an alignment laser source for reference and illumination for an interferometer. Optical parameters measured and corrected in accordance with the present invention include telecentricity, angle of scanned line, location of the plane in which the scanned line resides, astigmatism, and field curvature.

Figure 15:
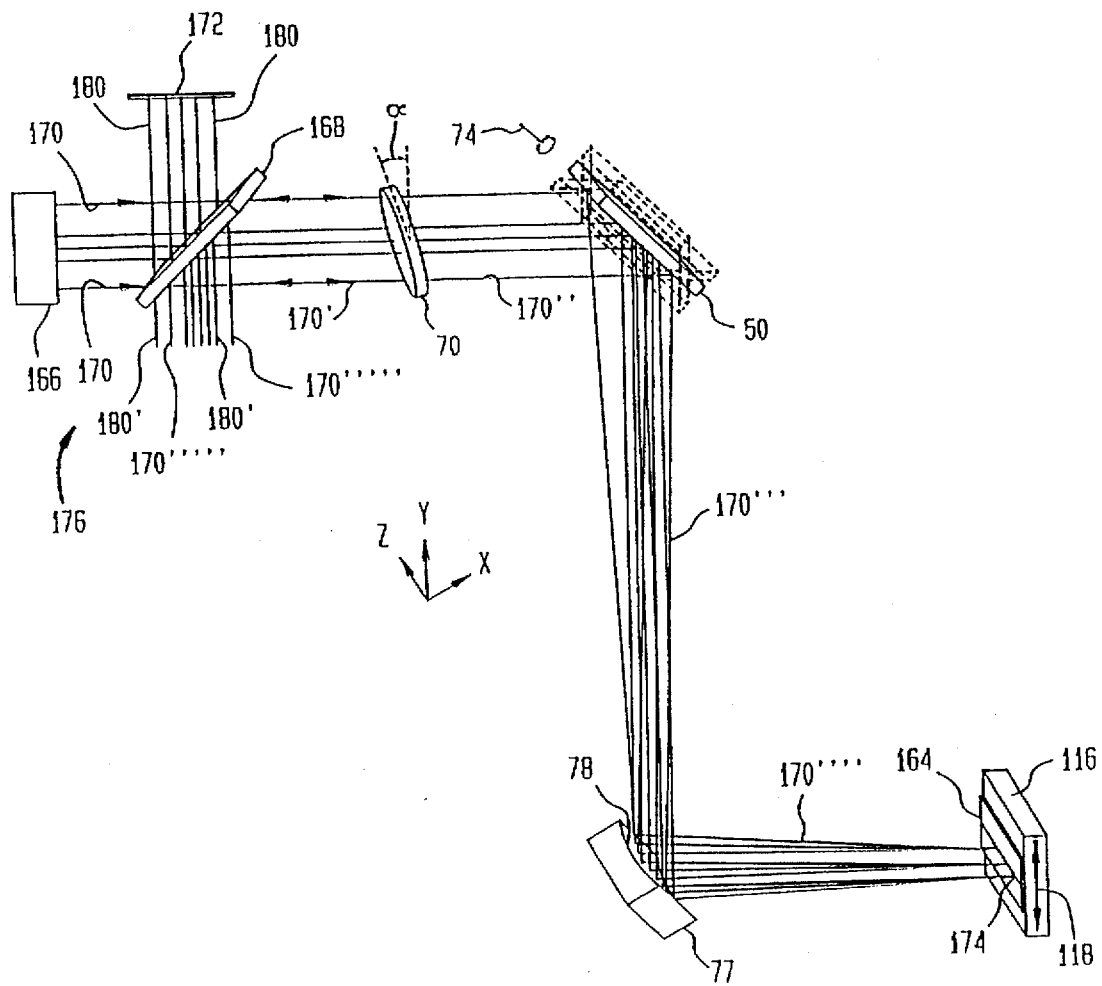
FIG. 15 illustrates the interferometric alignment system used in the preferred machining and tracking system of FIG. 9.

A preferred embodiment of the interference alignment system is shown in FIG. 15 in connection with the Mid-Objective Scanner described previously, illustrated as machining scanner system 79. This alignment system may be used for tracking scanner 90 in an analogous manner. Alignment laser source 166 is positioned to send object beam 170 along the same path as machining beam 25 was described previously. Mounted prior to lens 70 is beam splitter 168 (a partially transmissive, partially reflective mirror mounted at 45° to the path of object beam 170) which permits passage of a portion (e.g., 50%) of beam 170' straight through. Continuing object beam 170' then passes through the scanning system components as described, previously where beam 170" is reflected and scanned by galvanometer 50, beam 170''' is then reflected by concave cylindrical mirror 77 and beam 170'''' then becomes focused on optically flat object mirror 164. Mirror 164 is mounted on translation table 116 in the same position as workpiece 12 would be located. Mirror 164 directs the object beam back through the scanning system, retracing its previous path, until it impinges again upon the beam splitter 168, this time in the opposite direction as before. A portion of the returning object beam is then reflected 90° downward as beam 170''''. The beam portion 180 of original object beam 170 which was not transmitted through beam splitter 168 is reflected 90° upward to an optically flat reference mirror 172. Reference mirror 172 reflects reference beam 180 back down to beam splitter 168, where a portion 180' is transmitted straight through so that it interferes coherently with reference beam 170'''' to form an interference pattern in area 176. The resulting interference pattern is then evaluated for aberrations throughout dimensions of the scan. This interference alignment system can be used for any scanning system for a working beam, whether it be a high power machining beam or a low power tracking beam.

Observation of the interference pattern may reveal several potential problems. First, there may be "pupil wobble", wherein the interference pattern physically shifts from side to side, up and down, or a combination of both, as the beam is scanned. Second, there may be a change in the number of fringes that are seen as the beam is scanned along scan axis 174 or orthogonal translation axis 118 over the dimensions of mirror 164. Third, the total number of fringes may stay the same, but as the beam is scanned the fringes may seem to "collapse" toward the middle of the pattern, or they may seem to "expand" from the middle of the pattern. Finally, there may be a number of different patterns over the length of the scan.

System optical performance parameters can be calculated by counting the number of interference fringes that move and appear over the dimensions of the scan. In the first case discussed above, pupil wobble in one axis represents a tilt of the scan line. The wobble in an orthogonal axis represents a variation in telecentricity. Angular tilt and telecentricity can be easily calculated by well known methods in the art. In the second case, by watching for a change in the number of fringes and the location in the scan that they occur, actual field curvature can be computed. The value for field curvature (i.e., radius of curvature) can be calculated by well known techniques by counting the number of fringes. In the third case, the tilt of the image plane can be measured by well known techniques by the number of fringes that collapse or expand during the scan. In the last case, a variety of aberrations over the length of the scan can be evaluated by observing fringe patterns and making a conventional analysis.

These effects give accurate, quantifiable measurements of the aforementioned optical parameters of the scanning system. The various components of the machining and tracking system may be adjusted and aligned during this interferometric scanning process, which gives a "real time" view of image quality while the system is being aligned. For example, the tilt of lens 70 or 98 may be adjusted while viewing the interference pattern generated. The other components of the scanning system 79 or 90 may also be adjusted or, if necessary, replaced, to achieve optimum alignment. Since this process uses light to measure image quality, it has an accuracy on the order of one-quarter of a wavelength.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for verifying machining operations comprising:

means for generating a machining beam;

means for generating a tracking beam, said tracking beam being separate from said machining beam;

at least two lenses, one lens being positioned to at least partially focus said machining beam, another lens being positioned to at least partially focus said tracking beam;

means for tilting each of said at least two lenses at an angle to said machining and tracking beams to add an amount of astigmatism opposite to astigmatism in the remainder of said apparatus;

means for scanning said machining and tracking beams along an axis after said astigmatism is added by said lenses, said scanning means being movable and having a first surface for reflecting said machining beam and a second surface for reflecting said tracking beam;

at least two concave cylindrical mirrors having curved reflective surfaces, the curvatures of the reflective surfaces being substantially identical, one concave cylindrical mirror being positioned to receive and interrupt said reflected machining beam directly from said scanning means first surface and at least partially focus said machining beam at a workpiece, another concave cylindrical mirror being positioned to interrupt said reflected tracking beam directly from said scanning means second surface and at least partially focus said tracking beam at a detector;

a workpiece holder for securing a workpiece to receive said machining beam after reflection from said scanning means and said one concave cylindrical mirror;

a detector for receiving said tracking beam after reflection from said scanning means and said another concave cylindrical mirror;

feedback control means for determining the position of the reflected tracking beam relative to said detector and controlling the firing rate of said machining beam as said machining beam is being scanned by determining the position of said machining beam relative to said workpiece based upon the position of the reflected tracking beam relative to said detector;

a detector located proximate said workpiece holder for detecting the presence or absence of a plume generated by vaporization of material by said machining beam; and electronic control means for verifying the end point of the machining process based upon the presence or absence of a plume detected by said detector.

2. A method for verifying machining operations comprising the steps of:

a) generating a machining beam;

b) generating a tracking beam, said tracking beam being separate from said machining beam;

c) providing means for scanning said machining and tracking beams along an axis, said scanning means being movable and having a first surface for reflecting said machining beam and a second surface for reflecting said tracking beam;

d) providing at least two tiltable lenses, one lens being positioned to at least partially focus said machining beam prior to being reflected by said scanning means, another lens being positioned to at least partially focus said tracking beam prior to being reflected by said scanning means;

e) tilting each of said at least two lenses at an angle to said machining and tracking beams to add to said machining and tracking beams an amount of astigmatism opposite to astigmatism in the remainder of said system;

f) providing at least two concave cylindrical mirrors having curved reflective surfaces, the curvatures of the reflective surfaces being substantially identical, one concave cylindrical mirror being positioned to receive and interrupt said reflected machining beam directly from said scanning means first surface, another concave cylindrical mirror being positioned to interrupt said reflected tracking beam directly from said scanning means second surface;

g) simultaneously scanning said machining and tracking beams with said scanning means;

h) reflecting said machining beam received directly from said scanning means first surface off said one concave cylindrical mirror and at least partially focusing said machining beam at a workpiece;

i) reflecting said tracking beam received directly from said scanning means second surface off said another concave cylindrical mirror and at least partially focusing said tracking beam at a detector;

j) securing a workpiece to receive said machining beam after reflection from said one concave cylindrical mirror;

k) detecting said tracking beam after reflection from said another concave cylindrical mirror;

l) determining the position of the reflected tracking beam;

m) controlling said machining beam by determining the position of said machining beam relative to said workpiece based upon the detected position of the reflected tracking beam;

n) detecting a plume generated by vaporization of material by said machining beam; and o) verifying the end point of the machining process by electronic control means based upon the presence or absence of said plume.

* * * * *